United States Patent [19]

Rivera et al.

[11] Patent Number: 5,206,597
[45] Date of Patent: Apr. 27, 1993

[54] CAPACITIVE MOISTURE DETECTION APPARATUS

[75] Inventors: David F. Rivera, New London, Conn.; Charles E. Odams, Londonderry, N.H.; Michael J. McDonald, Jr., Niantic, Conn.

[73] Assignee: The United States of America as represented by the Secretary of the Navy, Washington, D.C.

[21] Appl. No.: 573,968

[22] Filed: Aug. 27, 1990

[51] Int. Cl.⁵ .............................................. G01R 27/26
[52] U.S. Cl. .................................... 324/664; 324/519; 324/689; 324/690
[58] Field of Search ............... 324/519, 543, 544, 539, 324/541, 663, 664, 665, 513, 515, 686, 688, 689, 690; 174/11 R

[56]  References Cited

U.S. PATENT DOCUMENTS

| | | | |
|---|---|---|---|
| 2,992,391 | 7/1961 | Haynes | 324/686 X |
| 3,288,895 | 11/1966 | Windeler | 324/688 X |
| 3,710,244 | 1/1973 | Rauchwerger | 324/664 |
| 3,821,640 | 6/1974 | Bahder et al. | 324/514 X |
| 3,973,187 | 8/1976 | Cereijo et al. | 324/519 X |
| 4,103,225 | 7/1978 | Stephens | 324/519 X |
| 4,177,097 | 12/1976 | Hudson, Jr. et al. | 324/519 X |
| 4,853,616 | 8/1989 | Gard | 324/525 X |
| 4,980,645 | 12/1990 | Soma et al. | 324/544 X |

FOREIGN PATENT DOCUMENTS 1458790  2/1989  U.S.S.R. ............................. 324/664

Primary Examiner—Jack B. Harvey
Attorney, Agent, or Firm—Michael J. McGowan; Prithvi C. Lall; Michael F. Oglo

[57] ABSTRACT

The invention is an apparatus for measuring the volume of water intrusion in underwater cables without dissecting the cables. The apparatus comprises a novel arrangement of a capacitive test fixture and an electrical impedance analyzer to provide measurement of the volume of water in a cable based on cable capacitance. The capacitive test fixture measures the electrical capacitance along the cable as the cable is fed through the test fixture.

5 Claims, 2 Drawing Sheets

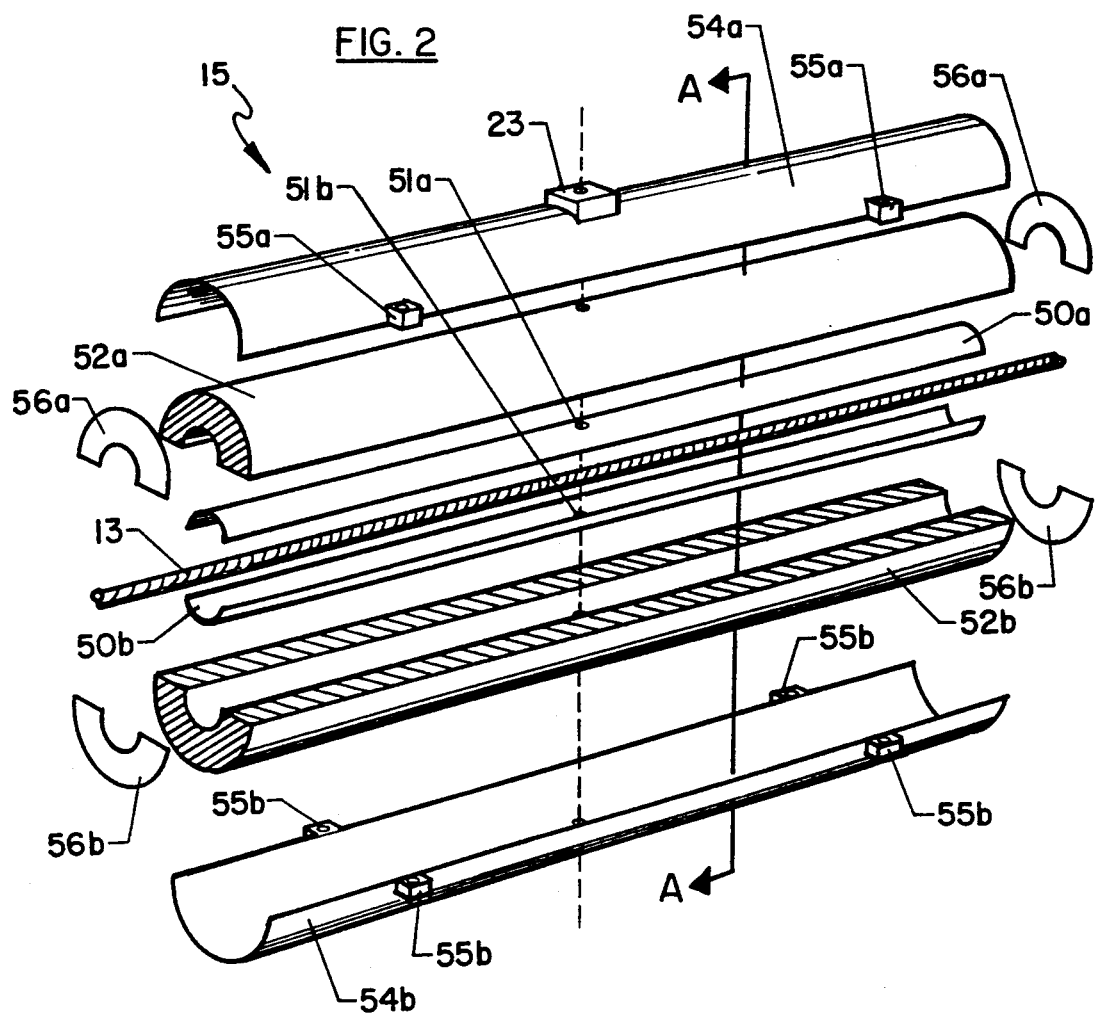
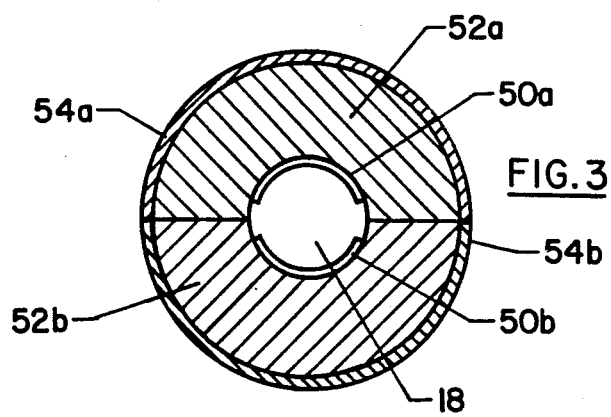

CAPACITIVE MOISTURE DETECTION APPARATUS

STATEMENT OF GOVERNMENT INTEREST

The invention described herein may be manufactured and used by or for the Government of the United States of America for Governmental purposes without the payment of any royalties thereon or therefor.

BACKGROUND OF THE INVENTION (1) Field of the Invention

The present invention relates to moisture detecting devices and more particularly to devices for measuring the amount and length of axial penetration of sea water in underwater transmission cables.

(2) Description of the Prior Art

Underwater connection of transmission cables invariably leads to axial penetration of water. In the past, underwater transmission cables such as submarine antennae were dissected in order to ascertain the extent of the axial penetration within the cables. This procedure, though accurately determining water migration, renders antennae useless for further service. In many instances, the electrical and mechanical behavior of cables is not seriously compromised even though there is a marginal level of water intrusion. Thus many cables, which are otherwise serviceable, have been rendered unusable by the prior art method of determining salt water intrusion.

SUMMARY OF THE INVENTION

Accordingly, it is an object of the present invention to provide an apparatus for measuring the extent of axial penetration of water within underwater cables.

It is a further object of the present invention to increase the usable life of an underwater electrical cable by providing an apparatus for measuring acceptable levels of water penetration within the cables without dissecting the cable.

Other objects and advantages of the present invention will become more obvious hereinafter in the specification and drawings.

In accordance with the present invention, an apparatus for the non-destructive measurement of the quantity and extent of salt water intrusion into the transmission line of a submarine buoyant cable antennae is provided. The apparatus comprises a novel arrangement of a moisture sensing assembly and electrical impedance analyzer to provide a measurement of moisture along any selected length of a transmission line. The amount of moisture present is proportional to the impedance detected.

BRIEF DESCRIPTION OF THE DRAWINGS

A more complete understanding of the invention and many of the attendant advantages will be better understood by reference to the accompanying drawings wherein.

FIG. 2 is an exploded view of the capacitive test fixture showing the location of its internal and external components; and FIG. 3 is a cross-sectional, assembled view along line AA of FIG. 2.

DESCRIPTION OF THE PREFERRED EMBODIMENT

Figure 1:
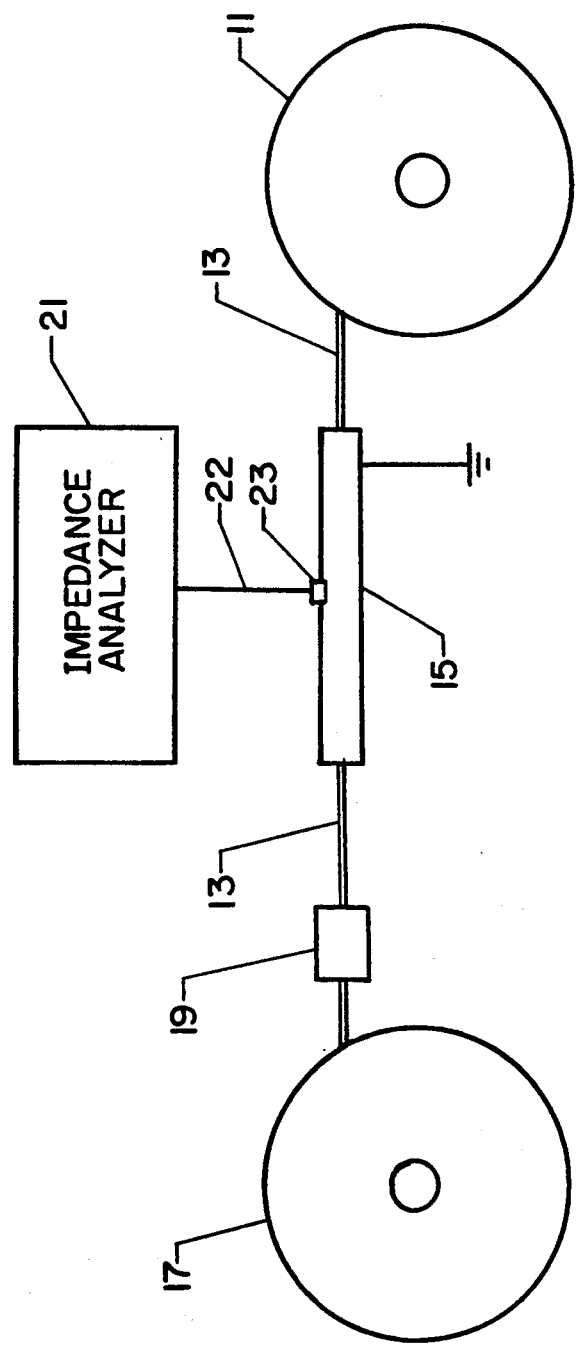
FIG. 1 is a schematic view of the capacitive moisture detection apparatus according to the present invention.

Referring now to the drawings, and in particular to FIG. 1, a schematic view is shown of the capacitive moisture detection apparatus, indicated generally by reference numeral 10. A feed spool 11 is wound with an underwater cable 13. Underwater cable 13 is fed from feed spool 11 through capacitive test fixture 15 and then rewound on a take-up spool 17. Underwater cable 13 is typically an underwater electrical cable being tested for water penetration within cable 13. One such cable is a submarine bouyant cable antenna.

Also provided are a distance counter 19 for measuring a length of cable 13 passing through test fixture 15 and an electrical impedance analyzer 21 for measuring the capacitance of cable 13 at a connection port 23 of test fixture 15. Impedance analyzer 21 is connected to test fixture 15 at connection port 23 via conductor 22. Conductor 22 may be any conventional coaxial conductor. Typically, distance counter 19 is calibrated to indicate the portion of cable 13 passing through test fixture 15 at connection port 23. Connection port 23 may be a conventional radio frequency connection port. Electrical impedance analyzer 21 displays a measured electrical capacitance indicative of a detected moisture level within cable 13 at connection port 23. The presence of moisture in the cable 13 is indicated by an increase in the capacitance of the cable 13. The approximate mathematical expression relating the measured value of capacitance to the volume of water in the cable is:

$$\frac{\text{Volume of Water}}{\text{Volume of Cable}} = \frac{(k)\ln(C/C_o)}{1 - (k)\ln(C/C_o)} \quad (1)$$

where, $k = 1/\ln(\epsilon_p/\epsilon_c)$, $\epsilon_p$ = dielectric constant of water relative to a vacuum, $\epsilon_c$ = dielectric constant of the cable material relative to a vacuum, c = measured wet cable capacitance, picofarads (pF), and $c_o$ = measured dry cable capacitance, picofarads (pF), The above relationship accurately measures the volume of water based upon capacitive measurements, if it is assumed that:

(1) the cable 13 is of constant volume;

(2) the cable 13 consists of material having uniform density and dielectric constant;

(3) there are voids within the cable 13 that become filled with water;

(4) the cross-section of cable 13 is uniform, i.e., no bulges or other defects are present on the cable's outer jacket;

(5) the flooded cable weight is the sum of weights of the material(s) constituting the cable 13 and water, respectively; and (6) the distribution of water is random within the voids inside the cable 13.

Referring now to FIG. 2, an exploded view of the capacitive test fixture 15 is provided showing the location of its internal and external components. Two curved electrical capacitance plates 50a and 50b oppose each other as shown around cable 13 for measuring electrical capacitance of cable 13. Plates 50a and 50b are typically made of brass. Cable 13 is shown only in section. Plates 50a and 50b maintain a spaced apart relationship and are placed in plate support beds 52a and 52b. Plate support beds 52a and 52b oppose each other as shown around plates 50a and 50b. Support beds 52a and 52b are constructed of any non-conducting material in order to isolate cable 13 within test fixture 15 from outside electrical interference. Finally, exterior shell plates 54a and 54b oppose each other as shown around support beds 52a and 52b. Exterior shell plates 54a and 54b are constructed of brass to (1) mechanically protect electrical capacitance plates 50a and 50b and (2) provide electrical shielding of cable 13 within test fixture 15 from radio-frequency interference. Further shielding can be accomplished by adding brass end caps 56a and 56b at either end of test fixture 15. The brass shell 54a and 54b and end caps 56a and 56b are maintained at an electric ground potential as indicated in FIG. 1. The above described encasement of cable 13 is typically accomplished by screwed attachment of exterior plate 54a to 54b via screw pads 55a and 55b, respectively.

Electrical connection of test fixture 15 to the electrical impedance analyzer 21 is accomplished via electrical connection to a connection port 23 provided on each of the exterior shell plates 54a and 54b. Port 23 extends through support beds 52a and 52b to allow the electrical connection of conductor 22 to electrical capacitance plates 50a and 50b at electrical connection points 51a and 51b, respectively.

Test fixture 15, in its assembled form, creates a cylindrical test fixture as shown in FIG. 3. FIG. 3 is a cross-sectional, assembled view along line AA of FIG. 2 where common elements share common reference numerals. Note the spaced apart relationship maintained between capacitance plates 50a and 50b. As is readily apparent, the elements of test fixture 15 form a cylindrical sleeve 18 for the passage of cable 13 as it moves from feed spool 11 to take-up spool 17.

The advantages of the present invention are numerous. By relating the electrical capacitance of a water-infiltrated cable to the volume of water in the cable and non-destructively measuring the capacitance, the usefulness of the cable can be easily determined. Of course, it will be understood that many additional changes in the details, materials, steps and arrangement of parts, which have been herein described and illustrated in order to explain the nature of the invention, may be made by those skilled in the art within the principle and scope of the invention as expressed in the appended claims.

What is claimed is:

1. An apparatus for detecting and measuring a volume of water in a cable, comprising:
   means for measuring electrical capacitance along the cable, said measuring means being formed of two joinable, symmetric encasements which form a sleeve when joined and the cable being disposed so as to movably pass through the sleeve at a predetermined rate;
   each of said encasements comprising i) a curved electrical conducting plate disposed in an arc of less than 180° about said cable, said conduction plate being electrically connected to a displaying means, and ii) cylindrical means for shielding said curved conducting plate from electrical interference, said cylindrical means disposed in an arc of 180° about said curved conducting plate;
   said cylindrical means comprising i) a clyindrical brass shell encasing said curved conducting plate, said brass shell being at an electrical ground potential, and ii) non-conducting material interposed between said curved conducting plate and said cylindrical brass shell;
   means for determining a position along the cable corresponding to said measured electrical capacitance; and
   said display means for displaying said measured electrical capacitance at said position wherein said measured electrical capacitance is indicative of the volume of water in the cable at said position.

2. An apparatus as in claim 1 wherein the volume of water relative to a known volume of the cable is determined by:

$$\frac{\text{Volume of Water}}{\text{Volume of Cable}} = \frac{(k)\ln(C/C_o)}{1 - (k)\ln(C/C_o)}$$

where
c = said measured electrical capacitance,
c = capacitance of the cable when dry,
k = $1/\ln(\epsilon_p/\epsilon_c)$ and
$\epsilon_p$ = relative dielectric constant of water, and
$\epsilon_c$ = relative dielectric constant of the cable.

3. An apparatus as in claim 1 further comprising means for moving the cable through the sleeve.

4. An apparatus as in claim 3 wherein said position determining means is a distance counter calibrated to indicate said position along the table.

5. An apparatus as in claim 4 wherein said displaying means is an electrical impedance analyzer.

* * * * *